United States Patent [19]
Vanell et al.

[11] Patent Number: 5,647,911
[45] Date of Patent: Jul. 15, 1997

[54] GAS DIFFUSER PLATE ASSEMBLY AND RF ELECTRODE

[75] Inventors: James Vanell, Tempe; Al Garcia, Gilbert, both of Ariz.

[73] Assignees: Sony Corporation, Tokyo, Japan; Materials Research Corp., Gilbert, Ariz.

[21] Appl. No.: 166,745

[22] Filed: Dec. 14, 1993

[51] Int. Cl.⁶ .................... C23C 16/00; F22B 13/00; F28D 15/00; H01B 7/34
[52] U.S. Cl. .................. 118/715; 122/366; 118/723 I; 165/104.21; 174/15.2
[58] Field of Search .................. 118/715, 723 R, 118/723 E, 723 ER, 723 I, 723 IR, 724, 725; 122/366; 156/345 P, 643.1; 165/104.21, 104.22, 104.22 A, 104.23, 104.24, 104.25, 104.26; 174/15.2

[56] References Cited

U.S. PATENT DOCUMENTS

| | | | |
|---|---|---|---|
| 1,894,593 | 6/1933 | Lamm | 165/104.21 |
| 3,282,814 | 11/1966 | Berghaus | 118/715 |
| 3,735,175 | 5/1973 | Blomgren, Jr. | 165/104.26 |
| 3,916,822 | 11/1975 | Robinson . | |
| 4,340,462 | 7/1982 | Koch . | |
| 4,434,742 | 3/1984 | Henaff et al. | 118/723 I |
| 4,512,391 | 4/1985 | Harra . | |
| 4,516,631 | 5/1985 | Russell | 165/104.21 |
| 4,599,135 | 7/1986 | Tsunekawa et al. . | |
| 4,629,635 | 12/1986 | Brors . | |
| 4,743,570 | 5/1988 | Lamont, Jr. . | |
| 4,834,020 | 5/1989 | Bartholomew et al. | 118/719 |
| 4,976,996 | 12/1990 | Monkowski et al. . | |
| 5,000,113 | 3/1991 | Wang et al. | 118/715 |
| 5,113,790 | 5/1992 | Geisler et al. . | |
| 5,232,508 | 8/1993 | Arena et al. | 118/715 |
| 5,445,709 | 8/1995 | Kojima et al. | 156/345 P |
| 5,456,757 | 10/1995 | Aruga et al. | 118/723 E |

FOREIGN PATENT DOCUMENTS

| | | |
|---|---|---|
| 0025670 | 3/1981 | European Pat. Off. . |
| 60-137016 | 5/1985 | Japan . |
| 2219311 | 12/1989 | United Kingdom . |

OTHER PUBLICATIONS

"What Is A Heat Pipe?", Brochure of Noren, (date unknown).

*Primary Examiner*—John Niebling
*Assistant Examiner*—Brian K. Dutton
*Attorney, Agent, or Firm*—Wood, Herron & Evans, L.L.P.

[57] ABSTRACT

The apparatus includes a gas diffuser plate having an integral heat pipe for accurately controlling the temperature of the diffuser plate during CVD processing to prevent unwanted tungsten (or other material) deposition on the diffuser plate. The apparatus is also useful as an RF plasma cleaning device in which the diffuser plate acts as an RF electrode, the heat pipe tube acts as an RF input lead, and the apparatus further includes a connector to an RF power source. Additionally, in combination, the heat pipe-cooled gas diffuser plate and RF electrode may be used advantageously in plasma enhanced chemical vapor deposition (PECVD).

16 Claims, 1 Drawing Sheet

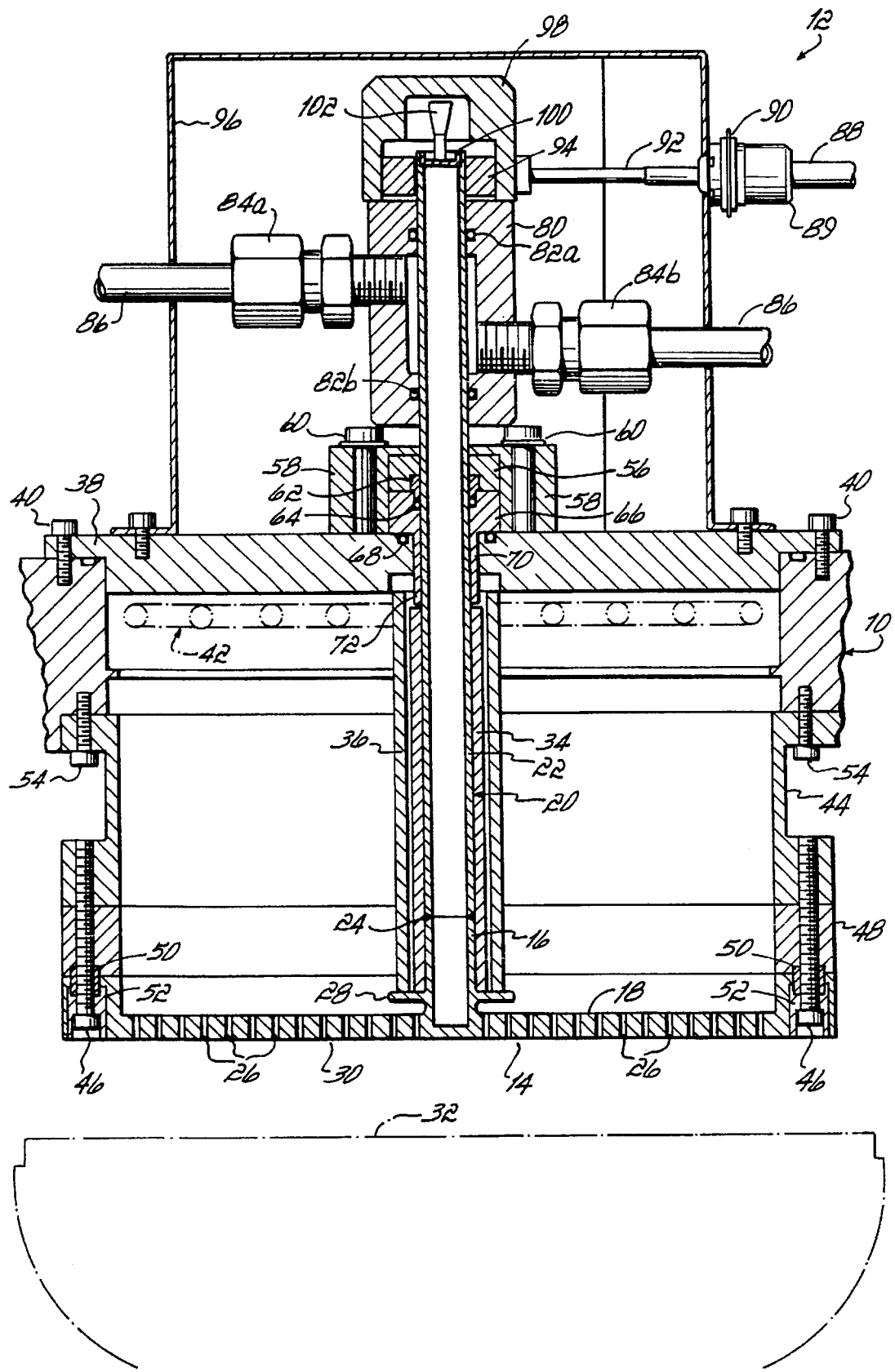

GAS DIFFUSER PLATE ASSEMBLY AND RF ELECTRODE

FIELD OF THE INVENTION

The present invention is directed to apparatus for use in chemical vapor deposition (CVD) processing and RF plasma cleaning of CVD reactors.

BACKGROUND OF THE INVENTION

In the field of CVD processing, particularly tungsten CVD, it is common to use a perforated gas diffuser plate located above the wafer to be deposited upon, to disperse the reactant gases. One problem which occurs when such apparatus is used, however, is the unwanted deposition of tungsten (or other material) on the gas diffuser plate itself and on other surfaces in the reaction chamber. Particles of the deposited material may fall from the diffuser plate onto wafers during subsequent CVD processing, thereby adversely affecting the end product. Thus, it is imperative to keep the diffuser plate clean from such deposits. One method of accomplishing this is to attempt to prevent the unwanted deposition from occurring at all by precise temperature control of the diffuser plate. Additionally, however, because unwanted deposition typically occurs on other surfaces of the CVD reactor, including the wafer platen (heated susceptor), regardless of the precautions taken, RF plasma cleaning of the CVD reactor frequently must be performed. To accomplish this, it is known to use the gas diffuser plate as an RF electrode.

It is known in the prior art to control the temperature of gas diffuser plates by applying air or liquid cooling to the diffuser plate via welded channels in, or metal tubing on, the diffuser plate. Alternatively, heat may be conducted away indirectly via air- or liquid-cooled surfaces upon which the diffuser plate rests. In either case, preventing unwanted deposition on the gas diffuser plate by means of temperature control presents several difficulties, including: 1) the high rate of radiant energy flow from wafer to gas diffuser plate; 2) obtaining temperature control without disturbing the gas flow pattern through the gas diffuser plate; 3) obtaining temperature control without introducing a cooling fluid to the interior of the reactor process chamber, either in tubes or welded channels; 4) obtaining symmetrical cooling of the gas diffuser plate; and 5) obtaining a sufficient rate of cooling to control the gas diffuser plate temperature within acceptable limits.

When the gas diffuser plate is used as an RF electrode for RF plasma cleaning, as discussed above, the cooling tubes on the diffuser plate are used as RF conductors and must be electrically isolated from the rest of the reactor. Alternatively, an isolated power tap passes through the wall of the reactor chamber and is attached to the isolated gas diffuser plate. In the latter case, the cooling tubes must be electrically isolated from the rest of the reactor. Several difficulties arise when introducing RF power to a temperature-controlled gas diffuser plate for the purpose of RF cleaning the heated wafer susceptor and the gas diffuser plate itself. These include the following: 1) insulating the rest of the reactor from the RF power on the gas diffuser plate; 2) positioning the RF power input to obtain even power distribution on the gas diffuser plate without affecting the temperature control system; and 3) providing RF power input without significant RF power loss due to electrical resistance in the input.

The present invention is designed to overcome the various drawbacks noted above with respect to gas diffuser plate temperature control and RF plasma cleaning apparatus.

SUMMARY OF THE INVENTION

In its broadest aspects, the present invention is directed to an improved gas diffuser plate assembly. The assembly is also useful as an RF plasma cleaning apparatus in the form of an upstanding tube (RF input) mounted to a gas diffuser plate (RF electrode).

The present invention has numerous advantages over prior art apparatus for cooling gas diffuser plates and for RF plasma cleaning. In particular, utilizing the apparatus of the present invention, cooling of the gas diffuser plate is substantially symmetrical and no cooling fluid is introduced within the process chamber, thus avoiding the risk of leaks within the reactor. Additionally, gas flow disturbances through the diffuser plate are minimized and cooling efficiency is optimized via direct liquid-cooling of the heat pipe. Moreover, use of the upstanding tube as the RF input minimizes RF input resistance and electrical isolation is made easier due to the single input.

The above-noted advantages are achieved using the improved gas diffuser plate assembly and RF electrode of the present invention. In one embodiment, the improved assembly includes a gas diffuser plate for use in CVD processing and a heat pipe mounted to the diffuser plate for controlling the temperature of the diffuser plate during CVD processing. In a preferred embodiment, the heat pipe/RF input is integrally mounted to the gas diffuser plate and the assembly further includes an isolator tube that surrounds at least a portion of the heat pipe to prevent the formation of excess plasma during RF plasma cleaning of the reactor interior and gas distributor components. The heat pipe extends generally perpendicular to and upward from the upper surface of the gas diffuser plate (i.e., the surface opposite the wafer susceptor), and coaxial with the axis of the diffuser plate.

As is well known in the art, gas diffuser plates are perforated with a gas diffusion hole pattern. In the assembly of the present invention, the upstanding heat pipe includes a circumferential shoulder flange adjacent and parallel to the upper surface of the gas diffuser plate for supporting the isolator tube. This arrangement permits the gas diffusion hole pattern to extend beneath the shoulder flange, thus minimizing gas flow disturbances. In a preferred embodiment, the improved gas diffuser plate assembly further includes a sealing member for sealing the heat pipe as it passes through a gas distributor cover in a CVD processing apparatus. Additionally, the assembly includes a non-electrically conducting cooling jacket fitted about a section of the heat pipe exterior to the reaction chamber. The cooling jacket has an inlet port and an outlet port through which cooling fluid flows to remove heat from the heat pipe. Finally, it is desirable to provide the lower surface of the gas diffuser plate (i.e., the surface opposite the mounted heat pipe) with a highly polished finish to prevent excessive radiant energy heat gain during CVD processing. This aids in more precisely controlling the temperature of the gas diffuser plate.

In an alternative embodiment, the apparatus of the present invention is used for RF plasma cleaning of a CVD reactor. In this embodiment, the gas diffuser plate acts as an RF electrode and an upstanding tube (the heat pipe tube) acts as an RF input lead mounted to the electrode. Additionally, the apparatus includes means for connecting the input lead to an RF power source. In a preferred embodiment, the RF plasma cleaning apparatus further includes one or more isolator tubes surrounding at least a portion of the RF input lead to prevent excessive RF plasma formation during RF plasma cleaning, and to prevent electrical shorting between the input lead and the CVD reaction chamber housing. Furthermore, the RF plasma cleaning apparatus includes means for mounting the RF electrode to the housing of a CVD reaction chamber. The mounting means preferably includes a quartz ring for insulating the electrode from the reaction chamber housing and further comprises multiple pairs of interlocking ceramic insulators to further insulate the electrode from the housing.

In yet another embodiment, the present invention comprises, in combination, an improved gas diffuser plate assembly and apparatus for RF plasma cleaning a CVD reactor. This embodiment includes a gas diffuser plate for use in chemical vapor deposition and which also acts as an RF electrode for RF plasma cleaning. A heat pipe is mounted to the gas diffuser plate for controlling the temperature of the diffuser plate during CVD processing; the pipe also acts as an RF input lead mounted to the RF electrode. The apparatus further includes means for connecting the RF input lead to an RF power source. It is contemplated that this embodiment of the present invention may be used in plasma enhanced chemical vapor deposition (PECVD).

These and other features and advantages of the present invention will become apparent to persons skilled in the art upon reading the detailed description of the invention taken in conjunction with the drawing.

BRIEF DESCRIPTION OF THE DRAWING

The FIGURE is a cross-section of a portion of a CVD reaction chamber showing the apparatus of the present invention mounted therein.

DETAILED DESCRIPTION OF THE INVENTION

With reference to the FIGURE, there is shown in breakaway a portion of a CVD processing chamber housing 10, which defines a vacuum reaction chamber, to which is mounted the apparatus 12 of the present invention. As shown, apparatus 12 includes all aspects of the present invention for each embodiment disclosed herein. It will be appreciated by persons skilled in the art that certain features to be described may pertain to one or more, but less than all, embodiments of the invention.

In a first embodiment, a gas diffuser plate 14 has a heat pipe stem 16 mounted thereto. Preferably, heat pipe stem 16 is machined concentrically into and is integral with upper surface 18 of gas diffuser plate 14 to increase conduction efficiency. Heat pipe 20 comprises stem 16 and an additional length of tubing 22 welded thereto to achieve the desired overall length of the heat pipe. The weld is represented at 24. Preferably, diffuser plate 14, integral heat pipe stem 16, and heat pipe tubing 22 are made of a highly conductive material such as 6061 T6 aluminum. However, it will be appreciated by persons skilled in the art that other highly conductive materials can be used, such as nickel 200.

Gas diffuser plate 14 is perforated with a gas diffusion hole pattern 26 to distribute the reactant gases evenly during CVD processing. As shown in the FIGURE, upstanding heat pipe stem 16 is provided with a circumferential shoulder flange 28 adjacent and parallel to gas diffuser plate 14. The flange 28 is spaced above diffuser plate upper surface 18 and permits the gas diffusion hole pattern to extend beneath the shoulder flange, thereby minimizing gas flow disturbances. Preferably, lower surface 30 of gas diffuser plate 14 is highly polished to a No. 4 finish to increase radiant heat rejection from the heated susceptor (wafer platen) 32, shown in phantom, which is typically spaced approximately one inch below gas diffuser plate 14. The details of a suitable CVD processing apparatus, including a rotating wafer susceptor, are disclosed in pending U.S. patent application Ser. No. 07/898,560, filed Jun. 15, 1992, the disclosure of which is fully incorporated herein by reference.

The improved gas diffuser plate assembly of the present invention further includes first and second ceramic isolator tubes 34, 36, respectively, which are concentric with and surround at least a portion of heat pipe 20. As shown, ceramic isolator tubes 34, 36 are supported by circumferential shoulder flange 28. The function of these isolator tubes is to prevent excessive RF plasma from forming around the heat pipe during CVD processing by isolating the hot tube from the reaction gases in the CVD processing chamber. Additionally, and as described more fully below, the isolator tubes 34, 36 aid in preventing electrical shorting between gas distributor cover 38 (which is at ground potential) and heat pipe 20 at the location where it passes through gas distributor cover 38. Gas distributor cover 38 is mounted to housing 10 by means of a plurality of screws 40. As shown in the FIGURE, a gas manifold halo 42 (shown in phantom) comprising four concentric gas distributor rings is located slightly below gas distributor cover 38 and supplies the CVD reaction gases to the processing chamber.

In all embodiments of the present invention, it is imperative to provide a seal which prevents vacuum leaks at the location where heat pipe 20 passes through gas distributor cover 38. This is accomplished by means of a shaft seal and a flange seal. As shown in the FIGURE, a ceramic seal plate 56 is pressed downwardly by two stainless steel clamps 58. Clamps 58 are biased against distributor cover 38 by spring washer/screw assemblies 60 to obtain a predetermined downward force on the seal components to insure proper sealing, to accommodate tolerance stacks in the seal components, and to take up dimensional changes due to thermal expansion which may occur during CVD processing. Seal plate 56 presses downwardly on a stainless steel ferrule 62 which in turn presses down on an O-ring 64 seated in ceramic seal body 66. The downward force exerted by clamps 58 on seal plate 56 also forces seal body 66 downwardly against gas distributor cover 38, which compresses the O-ring 68 located between seal body 66 and gas distributor cover 38. It should be noted that seal body 66 has a downwardly extending annular flange 70 which surrounds heat pipe 20 over the entire length of it which passes through gas distributor cover 38. The lower end 72 of annular flange 70 extends downwardly to a point where it meets ceramic isolator tube 34. As shown, the outer ceramic isolator tube 36 extends further upward than isolator tube 34, such that there is no direct line between gas distributor cover 38 and heat pipe 20. This prevents arcing when heat pipe 20 is used as an RF input lead, as described below.

With respect to heat pipe 20, such devices are known per se and are used for mold cooling in the plastics industry, and thus the specific details of heat pipes are known to persons skilled in the art. Generally speaking, in the present invention, heat pipe 20 is used to carry off heat from the gas diffuser plate 14 generated by radiant energy from the heated susceptor 32, as well as by the RF energy applied to the gas diffuser plate. Heat pipe 20 is provided with a felt or other suitable capillary wicking material liner (not shown). The heat pipe 20 is sealed with a liquid (e.g., acetone) therein under its own vapor pressure that enters the pores of the capillary material wetting all internal surfaces. By applying heat at any point along the surface of the heat pipe, the liquid at that point boils and enters a vapor state. When that happens, the liquid in the wicking material picks up the latent heat of vaporization and the vapor, which then is at a higher pressure, moves inside the sealed pipe to a cooler location where it condenses and re-enters the liner. Thus, the vapor gives up its latent heat of vaporization and moves heat from the "input" to the "output" end of the heat pipe. As a general frame of reference, heat may be moved along a heat pipe at a rate of approximately 500 mph.

With reference to the specific configuration utilized in the present invention, "input" end of heat pipe 20 is the end which is affixed to gas diffuser plate 14. The "output" end is the upper end shown in the FIGURE which has a liquid-cooling jacket 80 sealed around it. The seal is effected by O-ring shaft seals 82a and 82b. Cooling jacket 80 is preferably a polymeric material and is provided with TEFLON compression fittings 84a and 84b which connect TEFLON tubing 86 to cooling jacket 80. A suitable cooling liquid, such as water, flows through tubing 86 and cooling jacket 80 to carry heat away from heat pipe 20. This permits direct contact of the cooling liquid with the heat pipe for efficient conduction of heat from the heat pipe 20. Additionally, with this configuration, at no time is the CVD reactor chamber exposed to the possibility of an internal coolant leak, nor is there any corrosive effect on metal tubing by RF carrying liquid, as in prior art devices. As stated, the fluid which passes through TEFLON tubing 86 and carries the heat away from the heat pipe 20 may be water, although a variety of fluids can be used depending on the heat to be conducted away from the heat pipe 20. Heat pipe 20 also includes a cap 100 which is welded in place and has a fill tube 102 for filling the heat pipe with the desired fluid.

In the present invention, when it is desired to maintain the temperature of the gas diffuser plate 14 at or below 100° C., cooling water at 15° C. should be used. When it is desired to maintain the temperature of gas diffuser plate 14 at or below 200° C., cooling water at 40° C. has been found satisfactory, and in fact diffuser plate temperatures of approximately 140° C. have been achieved during CVD processing.

In an alternative embodiment, the improved assembly of the present invention is useful in RF plasma cleaning. In this embodiment, gas diffuser plate 14 acts as an RF electrode. For this purpose, gas diffuser plate 14 must be electrically isolated from the remainder of the reactor. As shown in the FIGURE, an aluminum spacer 44 is utilized to vary the gas diffuser plate-to-wafer spacing(s). Gas diffuser plate 14 is fastened to spacer 44 by means of screws 46, which are preferably made of a material that does not corrode in the presence of $NF_3$ plasma. One such material is Hastelloy C-22, which is a trade name of Hanes International, of Kokomo, IN. Suitable screws made of this material are available from Pinnacle Mfg. of Tempe, AZ. A quartz ring 48 electrically isolates gas diffuser plate 14 from aluminum spacer 44. Screws 46, which are at ground potential, are isolated from the gas diffuser plate by two interlocking ceramic isolator sleeves 50 and 52. Quartz is used for isolator ring 48 because of its significant resistance to thermal shock. This can be important since the gas diffuser plate below quartz ring 48 becomes heated to a higher temperature, and more rapidly than aluminum spacer 44 above quartz ring 48, thus inducing thermal shock and stress in ring 48. Screws 54, which may be made of the same material as screws 46, are utilized to affix aluminum spacer 44 to housing 10. It will be appreciated that a spacer 44 need not be utilized in the structure.

In this embodiment, upstanding heat pipe stem 16 and heat pipe tubing 22 act as an RF input lead to conduct RF power to RF electrode (gas diffuser plate) 14. Additionally, one or more isolator tubes 34, 36 are needed to electrically isolate and prevent arcing between tubing 22 and any parts of the reactor or housing, including distributor cover 38. Furthermore, the apparatus includes a seal around tubing 22 at the location where it passes through distributor cover 38, as described hereinabove and shown in the FIGURE.

Finally, the apparatus of this embodiment includes a shielded RF supplying cable 88 which is connected to an RF power source (not shown) and has a female UHF connection 89 at one end. Female connector 89 mates with male UHF connector 90, which in turn is coupled via a length of 12 gauge wire 92 to a stainless steel shaft collar 94 mounted at the upper end of heat pipe 20. With this arrangement there is minimal resistance to the flow of RF current. The segment of heat pipe 20 which is exposed above shaft collar 94 is isolated from the grounded metal shielding 96 by a polymer cap 98. This apparatus is believed to be capable of delivering 250–300 watts of RF power at 450 KHz to the RF electrode for plasma cleaning.

Utilizing the apparatus of the present invention, the temperature of gas diffuser plate 14 can be controlled within very close tolerances by means of heat pipe 22. Alternatively, during times when RF cleaning of the CVD processing chamber is required, RF current is supplied from an RF current source and is conducted via RF input lead (heat pipe tube 22) to RF electrode (gas diffuser plate 14). It is also contemplated that the apparatus of the present invention may be simultaneously utilized in both modes to cool gas diffuser plate 14, while RF current is supplied thereto, for example in plasma enhanced CVD (PECVD) processing.

While the present invention has been described with respect to the several specific embodiments shown, it will be appreciated by persons skilled in the art that various changes and modifications may be made to the apparatus without departing from the spirit and scope of the present invention as defined in the appended claims.

What is claimed is:

1. An improved gas diffuser plate assembly, comprising:
   a gas diffuser plate for use in chemical vapor deposition (CVD) processing;
   a heat pipe mounted to said gas diffuser plate for controlling the temperature of said gas diffuser plate during said CVD processing; and
   at least one isolator tube surrounding at least a portion of said heat pipe.

2. The improved gas diffuser plate assembly according to claim 1 wherein said heat pipe is integrally mounted to said gas diffuser plate.

3. The improved gas diffuser plate assembly according to claim 2 further comprising a sealing member for sealing said heat pipe to a gas distributor cover in a CVD processing apparatus.

4. The improved gas diffuser plate assembly according to claim 1 wherein said heat pipe extends perpendicularly from a surface of said gas diffuser plate, co-axial with the axis of said gas diffuser plate.

5. The improved gas diffuser plate assembly according to claim 4 wherein said gas diffuser plate is perforated with a gas diffusion hole pattern.

6. The improved gas diffuser plate assembly according to claim 5 wherein said heat pipe includes a circumferential shoulder flange adjacent and parallel to said gas diffuser plate and said at least one isolator tube is supported by said shoulder flange.

7. The improved gas diffuser plate assembly according to claim 6 wherein said gas diffusion hole pattern extends beneath said shoulder flange.

8. The improved gas diffuser plate assembly according to claim 1 further comprising a non-electrically conducting cooling jacket fitted about said heat pipe exterior to a reaction chamber in a CVD processing apparatus, said cooling jacket having a cooling fluid inlet port and a cooling fluid outlet port.

9. The improved gas diffuser plate assembly according to claim 1 wherein a surface of said gas diffuser plate opposite said heat pipe is polished.

10. A temperature-controlled gas diffuser plate assembly, comprising
    a gas diffuser plate for use in chemical vapor deposition (CVD) processing;
    a heat pipe mounted to said gas diffuser plate for controlling the temperature of said as diffuser plate during said CVD processing; and
    an isolator tube surrounding a portion of said heat pipe.

11. The temperature-controlled gas diffuser plate assembly according to claim 10 wherein said heat pipe is integrally mounted to said gas diffuser plate.

12. The temperature-controlled gas diffuser plate assembly according to claim 11 further comprising a sealing member for sealing said heat pipe to a gas distributor cover in a CVD processing apparatus.

13. The temperature-controlled gas diffuser plate assembly according to claim 12 further comprising a non-electrically conducting cooling jacket fitted about said heat pipe exterior to a reaction chamber in said CVD processing apparatus, said cooling jacket having a cooling fluid inlet port and a cooling fluid outlet port.

14. An improved CVD processing apparatus, comprising:
    a vacuum reaction chamber;
    means for maintaining a vacuum in said vacuum reaction chamber;
    a wafer susceptor positioned within said vacuum reaction chamber;
    a gas diffuser plate positioned within said vacuum reaction chamber and spaced from said wafer susceptor, said gas diffuser plate having a front surface confronting said wafer susceptor and a rear surface;
    a heat pipe mounted to said rear surface of said gas diffuser plate for controlling the temperature of said gas diffuser plate during CVD processing; and
    a reactant gas source for supplying reactant gases to said vacuum reaction chamber, said gases passing through said gas diffuser plate from said rear surface to said front surface;
    said heat pipe having a non-electrically conducting cooling jacket fitted about a portion thereof exterior to said vacuum reaction chamber, said cooling jacket having a cooling fluid inlet port and a cooling fluid outlet port.

15. The improved CVD processing apparatus according to claim 14 wherein said heat pipe passes through a wall of said vacuum reaction chamber.

16. The improved CVD processing apparatus according to claim 15, said apparatus further comprising a sealing member for sealing said heat pipe to a wall of said vacuum reaction chamber whereat said heat pipe passes through said wall.

* * * * *